United States Patent
Evans, Jr.

(10) Patent No.: US 9,269,416 B2
(45) Date of Patent: Feb. 23, 2016

(54) NON-VOLATILE COUNTER UTILIZING A FERROELECTRIC CAPACITOR

(71) Applicant: Radiant Technologies, Inc., Albuquerque, NM (US)

(72) Inventor: Joseph T. Evans, Jr., Albuquerque, NM (US)

(73) Assignee: Radiant Technologies, Inc., Albuquerque, NM (US)

( * ) Notice: Subject to any disclaimer, the term of this patent is extended or adjusted under 35 U.S.C. 154(b) by 102 days.

(21) Appl. No.: 14/160,343

(22) Filed: Jan. 21, 2014

(65) Prior Publication Data

US 2014/0133212 A1 May 15, 2014

Related U.S. Application Data

(63) Continuation-in-part of application No. 12/956,845, filed on Nov. 30, 2010, now Pat. No. 8,760,907.

(51) Int. Cl.
*G11C 11/22* (2006.01)

(52) U.S. Cl.
CPC .......... *G11C 11/2297* (2013.01); *G11C 11/221* (2013.01); *G11C 11/2273* (2013.01)

(58) Field of Classification Search
USPC .......... 365/145, 154; 713/502, 600, 151, 153, 713/102
See application file for complete search history.

(56) References Cited

U.S. PATENT DOCUMENTS

| | | | | | |
|---|---|---|---|---|---|
| 2,984,754 | A * | 5/1961 | Wolfe | ........................... | 327/227 |
| 3,737,789 | A * | 6/1973 | McCoy | ................. | G01R 23/10 327/265 |
| 3,930,238 | A * | 12/1975 | McLeod, Jr. | ........... | H01Q 3/385 713/600 |
| 3,990,049 | A * | 11/1976 | Wirth | ..................... | G06F 11/348 370/505 |
| 4,217,634 | A * | 8/1980 | Dalley | ............... | G05D 23/2418 324/119 |
| 5,381,379 | A * | 1/1995 | Fukumoto | ................ | G11C 7/00 365/145 |
| 5,396,461 | A * | 3/1995 | Fukumoto | .............. | G11C 14/00 365/149 |
| 5,488,587 | A * | 1/1996 | Fukumoto | .............. | G11C 11/22 365/222 |
| 5,963,466 | A * | 10/1999 | Evans, Jr. | ............... | G11C 11/22 257/295 |
| 6,118,688 | A * | 9/2000 | Hirano | .................... | G11C 11/22 365/145 |
| 6,225,840 | B1 * | 5/2001 | Ishimi | ....................... | G06F 1/04 327/116 |
| 6,480,967 | B1 * | 11/2002 | Jensen et al. | .................. | 713/600 |
| 2002/0145903 | A1 * | 10/2002 | Hasegawa | .............. | G11C 11/22 365/145 |
| 2004/0062071 | A1 * | 4/2004 | Rodriguez | ............. | G11C 11/22 365/145 |

(Continued)

OTHER PUBLICATIONS

International Search Report dated Apr. 30, 2015, PCT/US2015/012260.

*Primary Examiner* — Vu Le
*Assistant Examiner* — Sung Cho
(74) *Attorney, Agent, or Firm* — Calvin B. Ward (57) ABSTRACT

A counter that can include a plurality of count stages is disclosed. Each count stage includes a ferroelectric capacitor characterized by first and second polarization states, a variable impedance element, reset and count ports and a detector. The variable impedance element has an impedance between first and second switch terminals that is determined by a signal on a control terminal, the ferroelectric capacitor being connected between the control terminal and the first switch terminal. A reset signal coupled to the control terminal causes the ferroelectric capacitor to be polarized in the first polarization state. The count port is configured to receive pulses to be counted, the count port being connected to the first switch terminal by a conductive load. The detector generates a count complete signal if a potential on the first terminal exceeds a threshold value while the count port is receiving one of the pulses.

22 Claims, 8 Drawing Sheets

(56) References Cited

U.S. PATENT DOCUMENTS

| | | | | |
|---|---|---|---|---|
| 2004/0081003 A1* | 4/2004 | Shimada | G11C 11/22 | 365/200 |
| 2005/0063218 A1* | 3/2005 | Roohparvar | G11C 16/30 | 365/154 |
| 2005/0174841 A1* | 8/2005 | Ho | G11C 11/56 | 365/185.03 |
| 2005/0242849 A1* | 11/2005 | Muramatsu | H03K 23/56 | 327/151 |
| 2006/0140331 A1* | 6/2006 | Du | H03K 21/403 | 377/101 |
| 2010/0309710 A1* | 12/2010 | Evans, Jr. | G11C 11/22 | 365/145 |
| 2011/0305061 A1* | 12/2011 | Evans, Jr. | G11C 11/22 | 365/145 |
| 2011/0310651 A1* | 12/2011 | Evans, Jr. | G11C 11/22 | 365/145 |
| 2012/0134196 A1* | 5/2012 | Evans, Jr. | G11C 11/2273 | 365/145 |
| 2012/0275209 A1* | 11/2012 | Evans, Jr. | G11C 7/1006 | 365/145 |
| 2013/0293270 A1* | 11/2013 | Lee | H03K 5/00006 | 327/113 |
| 2014/0016239 A1* | 1/2014 | Kim | H02H 11/007 | 361/92 |
| 2014/0133212 A1* | 5/2014 | Evans, Jr. | G11C 11/2297 | 365/145 |
| 2015/0111558 A1* | 4/2015 | Yang | 455/418 | |

* cited by examiner

NON-VOLATILE COUNTER UTILIZING A FERROELECTRIC CAPACITOR

CROSS REFERENCE TO RELATED APPLICATIONS

This is a continuation in part of U.S. patent application Ser. No. 12/956,845 filed Nov. 30, 2010, said patent application being incorporated by reference herein.

BACKGROUND

There are a number of applications in which events need to be counted in an environment in which the counter is not connected to any power source during the time the events to be counted are being generated. In this environment, the only power is that provided by the signal that is presented by the event itself. In general, this signal is insufficient to power a conventional circuit and maintain the count during the periods in which no signal is connected to the counter.

In one exemplary application, a sensor attached to a door generates a small electrical pulse each time the door is operated. A piezoelectric signal generator uses the mechanical energy associated with opening the door to generate an electrical pulse. The designer wishes to count the number of pulses generated over time. During the time in which the counts are accumulating, no electrical power is available to the counter. After some time, the counter can be powered in a separate circuit and the stored count readout. However, the counter must retain the count during the times that no power is available and perform the counting operation using only the power provided by the sensor.

SUMMARY OF THE INVENTION

The present invention includes a counter having a first count stage. The first count stage includes a ferroelectric capacitor characterized by first and second polarization states, a variable impedance element, reset and count ports and a detector. The variable impedance element has an impedance between first and second switch terminals that is determined by a signal on a control terminal, the ferroelectric capacitor is connected between the control terminal and the first switch terminal. The reset port is configured to connect a reset signal to the control terminal, the reset signal causing the ferroelectric capacitor to be polarized in the first polarization state. The count port is configured to receive pulses to be counted, the count port being connected to the first switch terminal by a conductive load. The detector generates a count complete signal if a potential on the first terminal exceeds a threshold value while the count port is receiving one of the pulses.

In one aspect of the invention, the detector is powered by the received pulses that are to be counted. In another aspect, the count port includes a circuit that generates a predetermined pulse from each of the received pulses, the predetermined pulse is coupled to the conductive load.

In another aspect of the invention, the first count stage includes a delay circuit that couples a count complete signal to the reset port after a predetermined time delay.

In yet another aspect of the invention, the counter includes a second count stage having a similar structure to the first count stage, and the count complete signal of the first count stage is coupled to the count port of the second count stage.

In a still further aspect of the invention, the multi-stage counter includes a disconnect switch that decouples the output port of the first count stage from the count port of the second count stage. In addition, a parallel connect switch connects the count port of the first count stage to the count port of the second count stage. First and second count complete terminals coupled to the detectors in the first and second count stages, respectively, present the count complete terminals to connectors that are accessible by a device external to the counter.

DETAILED DESCRIPTION OF THE PREFERRED EMBODIMENTS OF THE INVENTION

Figure 1:
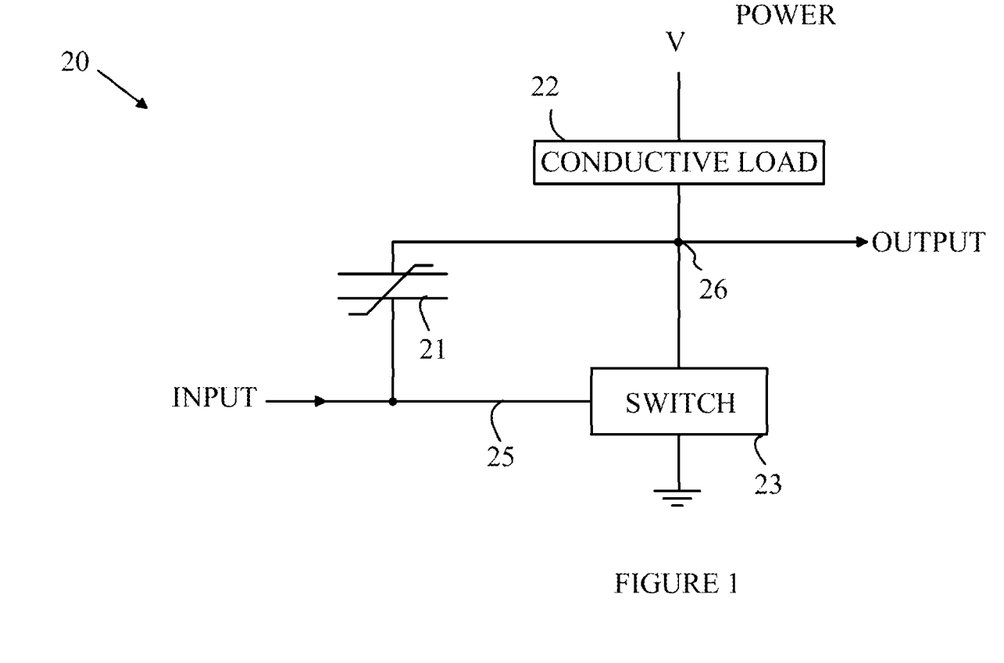
FIG. 1 illustrates an autonomous memory circuit that is used to construct a counter according to the present invention.

The manner in which the present invention provides its advantages can be more easily understood with reference to an analog ferroelectric memory cell such as that disclosed in the above-mentioned U.S. patent application. Refer now to FIG. 1, which illustrates an autonomous memory circuit that is used to construct a counter according to the present invention. Autonomous memory circuit 20 includes a ferroelectric capacitor 21 and a switch 23 having a current actuated control input 25. A conductive load 22 is connected between a power rail and switch 23.

Ferroelectric capacitor 21 has a remanent polarization that can be switched by applying a voltage across ferroelectric capacitor 21. That is, in the absence of a voltage across the capacitor, the dielectric of the capacitor is electrically polarized. The dielectric has two fully polarized states corresponding to the dielectric being polarized fully up or down. In addition, the dielectric can occupy a continuous range of remanent polarization states between these two extremes. If a voltage is applied across the ferroelectric capacitor, an electric field is created in the ferroelectric capacitor. If the field direction is the same as that of the remanent polarization, a small current flows in the circuit connecting the two plates of the ferroelectric capacitor. If, on the other hand, the applied electric field is in a direction opposite to that of the remanent polarization, the remanent polarization will change direction to conform to the new field direction, and a large current will flow in the external circuit. The magnitude of the current and the voltage at which it flows can be set by adjusting the composition, area, and thickness of the ferroelectric capacitor.

Switch 23 changes from a high impedance state to a low impedance state when a current enters current actuated control input 25. In autonomous memory circuit 20, it is assumed that the potential of the input line to switch 23 remains at or near ground independent of the state of the switch. To simplify the following discussion, it will be assumed that the power rail is positive and that the "up" remanent polarization state is set when the positive rail potential is applied across the plates of ferroelectric capacitor 21. However, other embodiments in which the input is referenced to power and the output is referenced to ground can be utilized.

First, assume that ferroelectric capacitor 21 is polarized in the up state. When power is turned on, switch 23 is initially in the off state; hence, the potential at node 26 will increase to V. Thus, the field applied to ferroelectric capacitor 21 will also be in the up direction, and ferroelectric capacitor 21 will not flip states. Accordingly, little current will flow into the input of switch 23, switch 23 will remain off, and the output of autonomous memory circuit 20 will quickly go to the potential of V.

Next, assume that ferroelectric capacitor 21 is polarized in the down state. When power is turned on, the applied electric field across ferroelectric capacitor 21 will be opposite to that of the remanent polarization of ferroelectric capacitor 21, and ferroelectric capacitor 21 will flip states to match the applied electric field. In this case, a large current will flow into the control input of switch 23, and switch 23 will enter the conducting state. Node 26 will drop to an intermediate state that is less than V. The specific potential will depend on the details of the switch. This intermediate state will remain until ferroelectric capacitor 21 finishes switching to its up state. This will occur when a predetermined charge flows into ferroelectric capacitor 21. At that point there will be no more switching charge flowing out of ferroelectric capacitor 21 and into switch 23. Switch 23 will again enter the non-conducting state at this point, and the potential on node 26 will increase back to V.

Figure 2A:
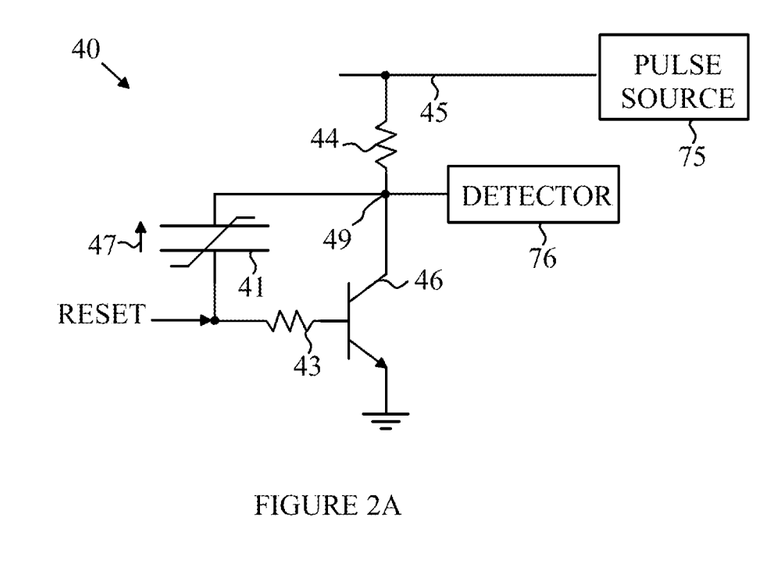
FIGS. 2A and 2B are schematic drawings of an autonomous memory circuit of the type shown in FIG. 1.
Figure 2B:
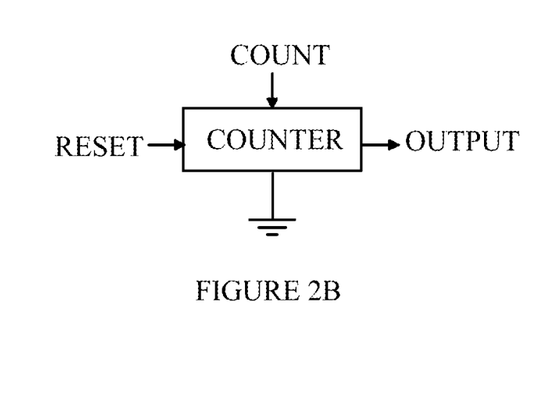

A number of different circuit elements can be utilized for switch 23; for example, switch 23 can be constructed with field effect transistors or other types of transistors. Refer now to FIGS. 2A and 2B, which are schematic drawings of a ferroelectric autonomous memory circuit 40 of the type shown in FIG. 1 which utilizes as the switch an NPN transistor 46 having a base resistance 43. The conductive load is a resistor 44. On power up, any charge displaced from ferroelectric capacitor 41 must pass through the Base/Emitter circuit of NPN transistor 46 to ground, causing a greater conduction of current through the Collector/Emitter path of the transistor. If ferroelectric capacitor 41 starts down, it will switch to the up state during power up. The switching time of ferroelectric capacitor 41 is determined both by the restriction of resistor 44 and by the amplification of the ferroelectric charge by transistor 46 attempting to prevent the capacitor from switching. After power up, the state of ferroelectric capacitor 41 will be in the up polarization state as indicated by arrow 47. To simplify the remaining drawings, this autonomous memory cell configuration will be represented by the symbol shown in FIG. 2B. It is to be understood, however, that the symbol shown in FIG. 2B can be used to represent other embodiments of the autonomous memory cell shown in FIG. 1 in which the input is used as a reset signal and the count terminal is used as the pulse source.

Figure 3:
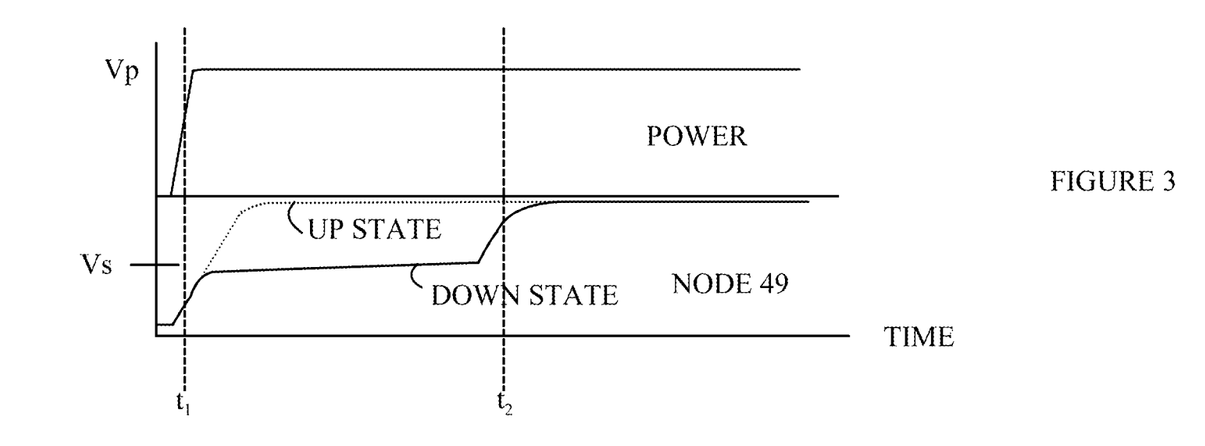
FIG. 3 illustrates the potential on the power rail and on node 49 shown in FIG. 2A.

Refer now to FIG. 3, which illustrates the potential on the power rail and on node 49 shown in FIG. 2A as a function of time when the ferroelectric capacitor is initially polarized in either the up or down state. If ferroelectric capacitor 41 is in the down state when ferroelectric autonomous memory circuit 40 is powered up, the potential on node 49 initially increases with the power rail potential until the potential at node 49 reaches a value that causes ferroelectric capacitor 41 to begin to change polarization state. As ferroelectric autonomous memory circuit 40 is powered up with ferroelectric capacitor 41 in the down state, ferroelectric capacitor 41 begins to flip polarization, and charge is released that causes NPN transistor 46 to begin to conduct. If NPN transistor 46 begins to conduct too much, the potential on node 49 begins to drop and ferroelectric capacitor 41 slows its switching. If NPN transistor 46 does not conduct enough, the potential on node 49 rises faster causing ferroelectric capacitor 41 to switch faster forcing more current into the control input of NPN transistor 46 increasing its conductivity. Thus, the circuit stabilizes with the potential of node 49 at a specific intermediate value with a slow rate of rise. In this manner, the change in conductivity of NPN transistor 46 limits the voltage rise at node 49 until the change in state of ferroelectric capacitor 41 is completed. At this point, no further switching charge will be released from ferroelectric capacitor 41, and hence, NPN transistor 46 will again become non-conducting. The potential during the transition of ferroelectric capacitor 41 will be referred to as the "shelf voltage", $V_s$, in the following discussion. The specific shape of the potential at node 49, or the analogous node in autonomous memory circuits based on other forms of switches, will, in general, depend on the specific switch implementation, and the relationships between the switch, the ferroelectric capacitor, and the sensing element if there is one.

Referring again to FIG. 3, and in particular the dotted curve, the potential on the power rail and on node 49 shown in FIG. 3 is shown as a function of time when ferroelectric autonomous memory circuit 40 is powered up with ferroelectric capacitor 41 in the up state. Since ferroelectric capacitor 41 does not switch during power up, little current flows into the control input of NPN transistor 46 and NPN transistor 46 never conducts. The potential on node 49 immediately rises to the voltage on the power line 45.

Consider the case in which the autonomous memory circuit is initially polarized in the down state and then power is applied to the power rail and interrupted while node 49 is still at the shelf voltage, i.e., before ferroelectric capacitor 41 has completely flipped polarization. If the power is then turned back on at a later time, the process of flipping the polarization of ferroelectric capacitor 41 will resume where it left off when power was interrupted. The process can be repeated until the total time the power rail is at voltage equals the time at which the shelf voltage would have terminated if power had been applied continuously.

Figure 4:
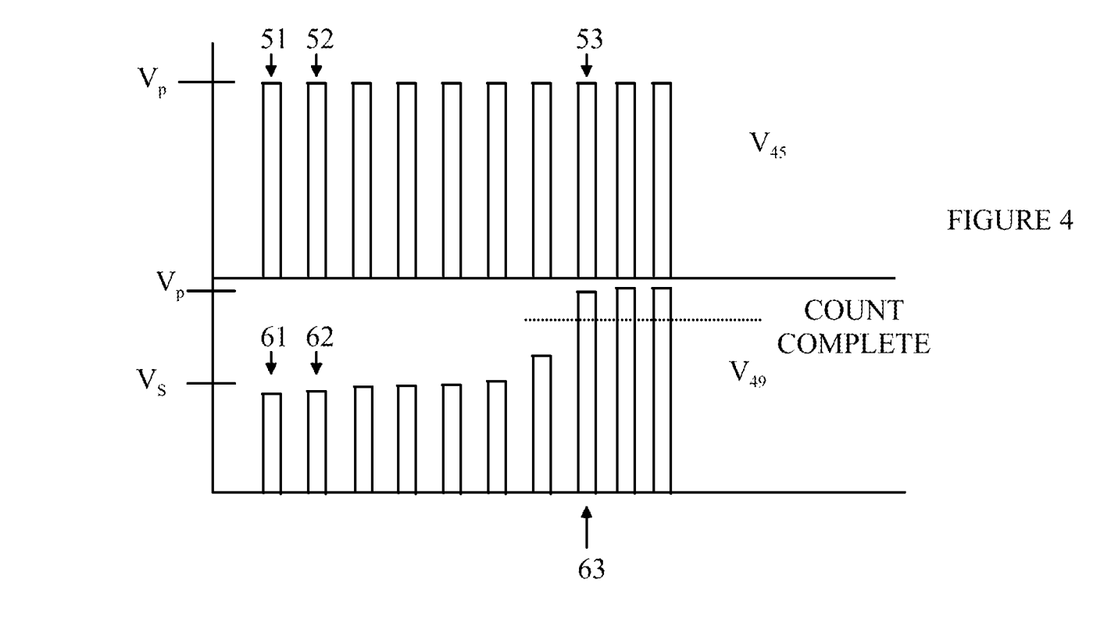
FIG. 4 illustrates the potential on node 49 when power line 45 is repeatedly pulsed.

Refer now to FIG. 4 which illustrates the potential on node 49 when power line 45 is repeatedly pulsed. It is assumed that ferroelectric capacitor 41 is fully polarized in the down state at the beginning of the process. To simplify the following discussion, it will be assumed that the pulses on power line 45 are all of equal duration and amplitude although the circuit may be operated with pulses of dissimilar amplitude and pulse width for purposes other than linear counting. Denote the duration of each pulse at a potential above the shelf voltage by DT. Initially, ferroelectric capacitor 41 is polarized in the down state, and hence, the potential at node 49 rises to $V_s$ in response to each pulse on power line 45. Exemplary early pulses are labeled at 51 and 52. The corresponding pulses at node 49 are shown at 61 and 62, respectively. When the sum of the DTs is equal to $t_2-t_1$ shown in FIG. 3, ferroelectric capacitor 41 will have completely flipped polarization state. Hence, the next pulse will result in the potential at node 49 rising to $V_p$ as shown at 63. Successive pulses on power line 45 will likewise generate pulses on node 49 that have an amplitude of $V_p$ rather than $V_s$. The number of pulses needed to flip the polarization such that the response to the next pulse provides a response at $V_p$ instead of $V_s$ will be referred to as the saturation pulse count in the following discussion. The saturation pulse count can be detected by monitoring the voltage on node 49, the saturation pulse count being indicated by a voltage above a threshold value that will be referred to as the count complete threshold.

Refer again to FIG. 2A. Assume that ferroelectric capacitor 41 is initially polarized in the down direction by a reset pulse on the RESET line and then subjected to an unknown number of pulses from pulse source 75, the number being less than the saturation count. The actual number of counts stored can be determined by connecting power line 45 to $V_p$ and measuring the time needed for node 49 to rise to $V_p$ as measured by detector 76. This time is related to the saturation pulse count minus the number of pulses that have already been received. Similarly, the current count can be determined by pulsing power line 45 and counting the number of pulses that result in node 49 responding with a voltage substantially above the shelf voltage. The difference between this count and the saturation count can be used to determine the count that was stored in the counter.

Ferroelectric autonomous memory 40 can be preprogrammed such that a predetermined number of pulses will result in an output signal to detector 76 that is greater than $V_s$. In this aspect of the invention, ferroelectric capacitor 41 is polarized in the down direction by a reset pulse and then a number of pulses are added to ferroelectric autonomous memory 40. In this case, the number that is initially added is the saturation pulse count less the predetermined number in question.

In a mode in which detector 76 is used to detect the acquisition of the saturation pulse count during actual counting, detector 76 would need to have a power source. During the time in which the count signal is active, detector 76 can be powered from the count pulse source. As will be explained in more detail below, part of the power from the pulse source can be stored to power the counter for a short period of time after the count has been updated. In this case, the detector can return a signal indicating that the saturation count was reached after the pulse has terminated.

Figure 5A:
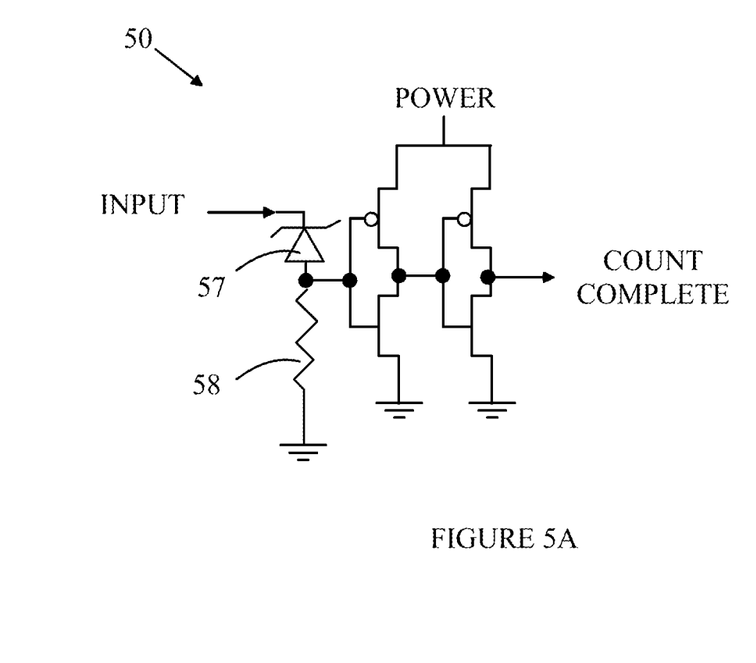
FIGS. 5A and 5B illustrate an embodiment of a detector according to the present invention.
Figure 5B:
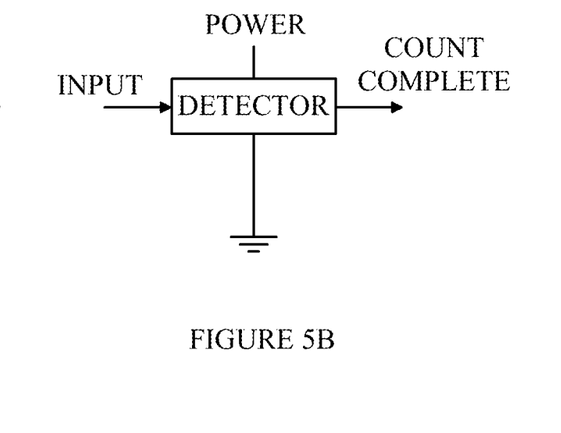

Refer now to FIGS. 5A and 5B, which illustrate an embodiment of a detector according to the present invention. FIG. 5A is a schematic drawing of detector 50, and FIG. 5B is a symbolic representation of a detector such as detector 50. However, it is to be understood that the symbolic representation of a detector is not limited to the specific circuit shown in FIG. 5A. In one aspect of the invention, detector 50 is powered directly from the count signal. However, as will be explained in more detail below, detector 50 can be powered from any source that is available when the count signal is generated. When the potential from the autonomous memory cell output exceeds the zener voltage of zener diode 57, current flows through resistor 58 and generates a voltage that produces an output signal. If the potential at the input is less than the zener voltage, no output signal is produced. The output signal is available as long as the count signal is present.

The above-described embodiments of a counter according to the present invention have a single counting stage. Some applications require a count capacity that is greater than the saturation pulse count of a single autonomous memory circuit. The manner in which a multi-"digit" counter is constructed from a plurality of autonomous memory circuits will now be discussed in more detail with reference to FIG. 6 which illustrates the first two stages of a multi-stage counter. Multi-stage counter 80 counts pulses from a pulse source 90. It is assumed that pulse source 90 has sufficient power to power multi-stage counter 80 during the period in which the pulse signal from pulse source 90 is present. If the time needed to complete the counting operation is greater than the duration of the pulse signal, a power storage device 83 can be utilized to extend the pulse signal. For example, power storage device 83 could include a capacitor that stores sufficient power to provide power to the various components during the counting operation.

Figure 6:
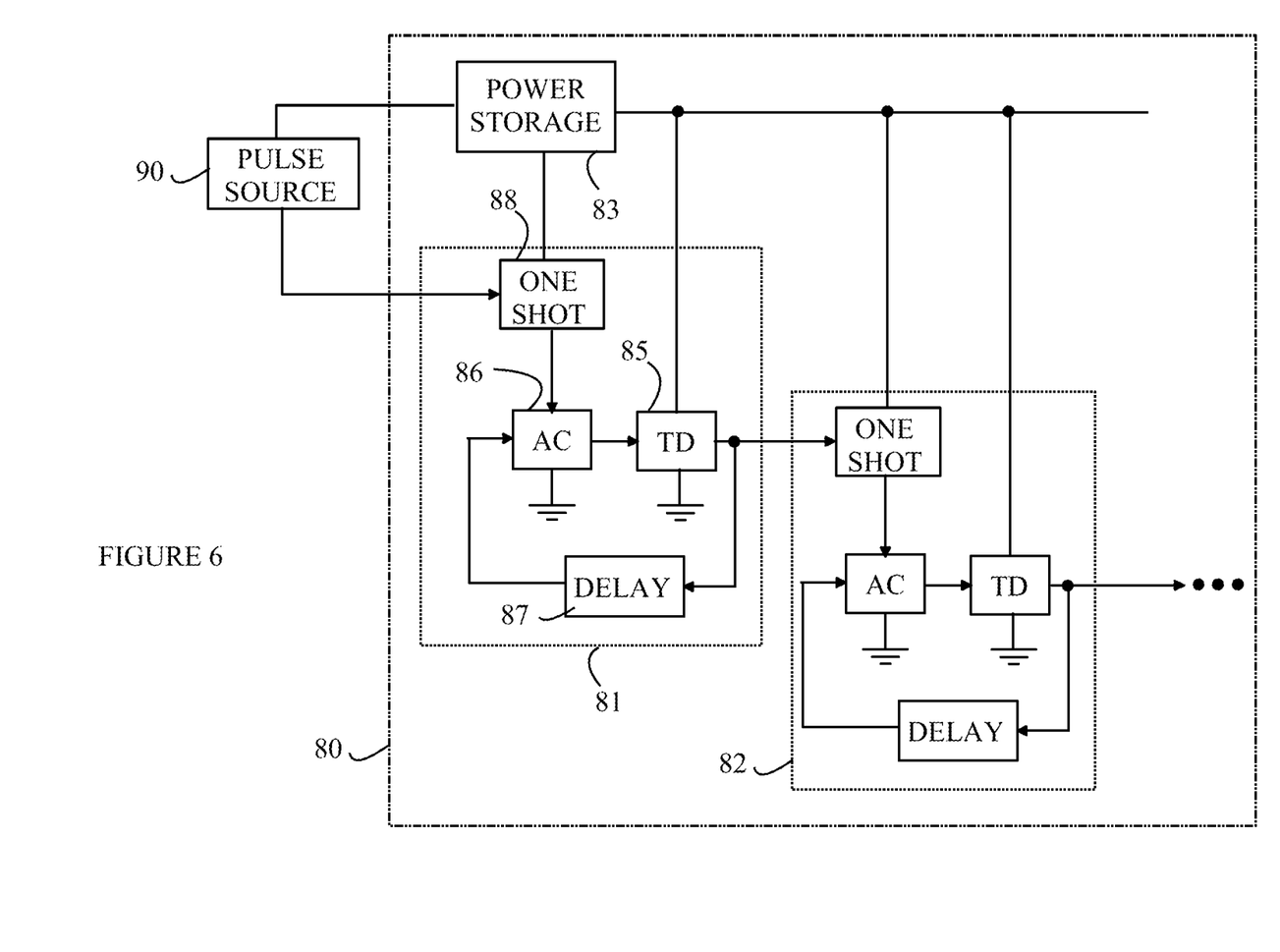
FIG. 6 illustrates the first two stages of a multi-stage counter.

To simplify the following discussion, only the first two stages of multi-stage counter 80 are shown. The least significant "digit" is counted in stage 81. When a count completion signal is generated by threshold detector 85, an overflow signal is sent to stage 82, which counts the overflow signals from stage 81. The overflow signal is used to reset autonomous memory circuit 86 in stage 81 after a delay that is generated by delay circuit 87. Delay circuit 87 must provide a sufficient delay to prevent a race condition from causing autonomous memory circuit 86 to reset before the output of stage 81 triggers a count in stage 82. To simplify the drawing, the power connections to the delay circuits have been omitted from the drawing. In general, the delay circuit only needs to be active during the time needed to complete the stage updates associated with the current count. Hence, if power is needed, the power can be supplied by power storage device 83.

Since the autonomous memory circuits essentially integrate the count pulse, a pulse shaping circuit such as one shot 88 can be included in the stages. The one shots ensure that each pulse that is counted has the same shape and hence, each pulse contributes the same amount of charge to the ferroelectric capacitor. In addition, if the one shots trigger off of the raising edge of the input signal to the one shots, the time needed to complete the counting operation can be reduced.

In many cases, the minimum length pulse needed to count is significantly less than the duration of the pulse from the pulse source. The power storage mechanism must provide power for a period of time that is long enough for the count completion signals to propagate through all of the stages of the counter. By shortening the pulse length for the pulse that is actually counted, the amount of time that power storage device 83 must maintain power can be significantly reduced.

While the example shown in FIG. 6 only shows two stages, it will be appreciated that counters having higher numbers of stages can be constructed in an analogous manner. In such multi-stage counters, the count complete signal from stage K is counted in stage K+1. Each time as the stage reaches its saturation pulse count, the count complete signal for that stage is also used to reset that stage by returning the ferroelectric capacitor to a fully polarized state in the opposite direction to that of the polarized state in which the count complete signal is generated.

A multi-stage counter can also, in principle, be read out by adding pulses until the last stage generates a count completed signal. The number of pulses that must be added and the known capacity of the counter can then be used to determine the count that was actually in the counter at the start of the readout process. However, for counters with a large number of stages, the readout time can be excessive. In one aspect of the invention, each stage of the counter is readout in parallel by isolating that stage from the stages on each side of that stage and routing the count complete signals from each stage to a controller. The isolated stages are then pulsed in parallel and the number of pulses needed to cause a count complete signal to be generated in that stage is determined.

Figure 7:
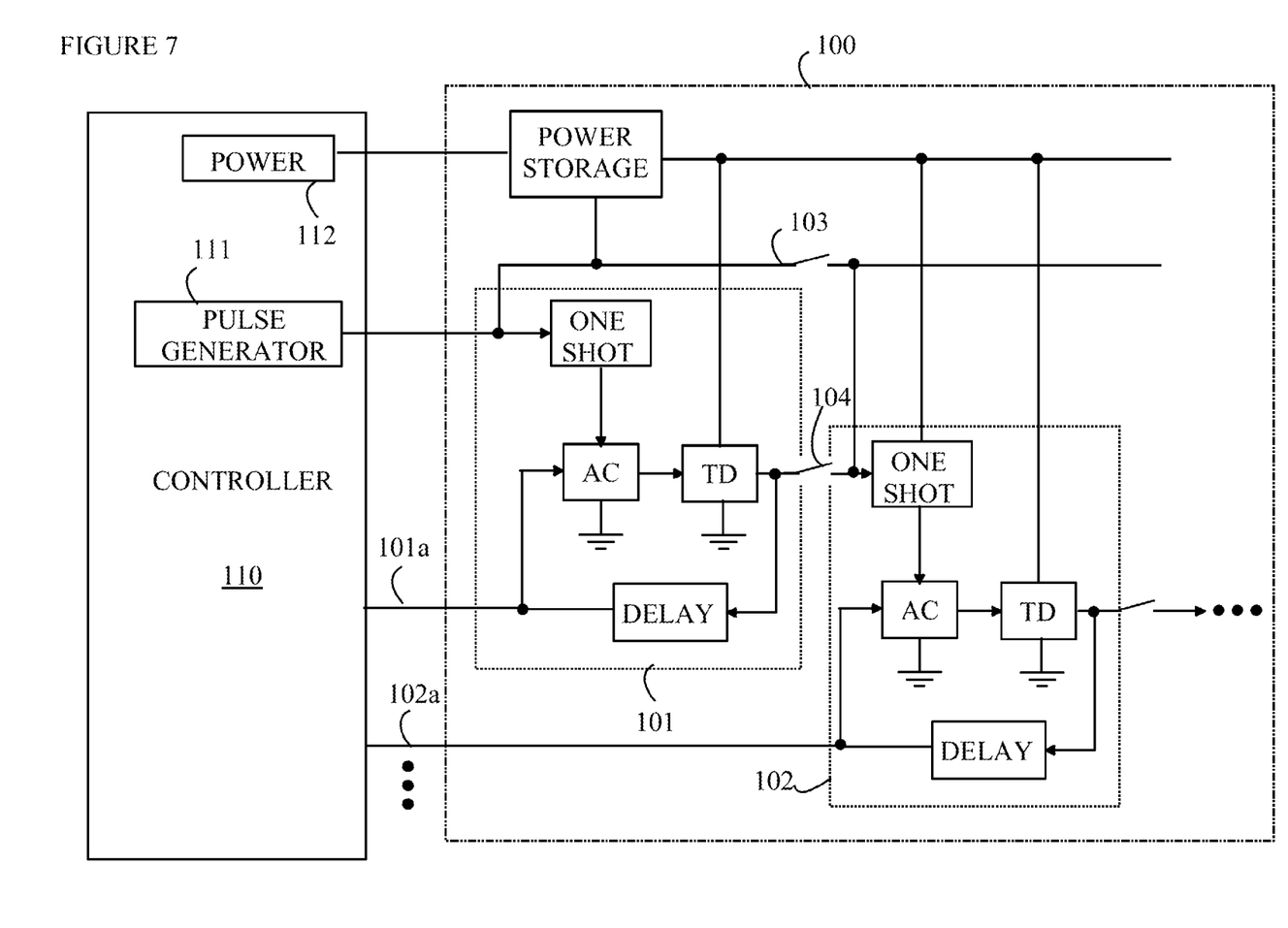
FIG. 7 illustrates a multi-stage counter that uses a parallel readout method.

Refer now to FIG. 7, which illustrates one embodiment of a multi-stage counter 100 that uses this parallel readout method. Again, to simplify the drawing only the first two stages of multi-stage counter 100 are shown. The least significant count stage is shown at 101 and the next most significant stage is shown at 102. Multi-stage counter 100 includes a switch 103 that is open during normal counting. This switch limits the pulse input to the one shot in the least significant count stage. During readout, switch 103 is closed. As a result, the pulses from pulse generator 111 are routed to the one shot in each of the stages. Each of the stages with the exception of the last stage includes an isolation switch such as isolation switch 104. The isolation switch blocks the count complete signal from the stage in question from being input to the next stage. Isolation switch 104 is also opened during the readout operation.

Multi-stage counter 100 also routes the count complete signals to externally available conductors. The external conductors for stages 101 and 102 are shown at 101a and 102a, respectively. The count in multi-stage counter 100 is determined with the aid of a controller 110 that includes a pulse generator 111 that provides the readout pulses to the stages and a power source 112. It should be noted that power source 112 is optional, in that the power storage component could also power multi-stage counter 100 during readout. Controller 110 monitors the count complete signal lines from each stage and records the number of pulses that resulted in the count complete signal being generated by each stage.

Figure 8:
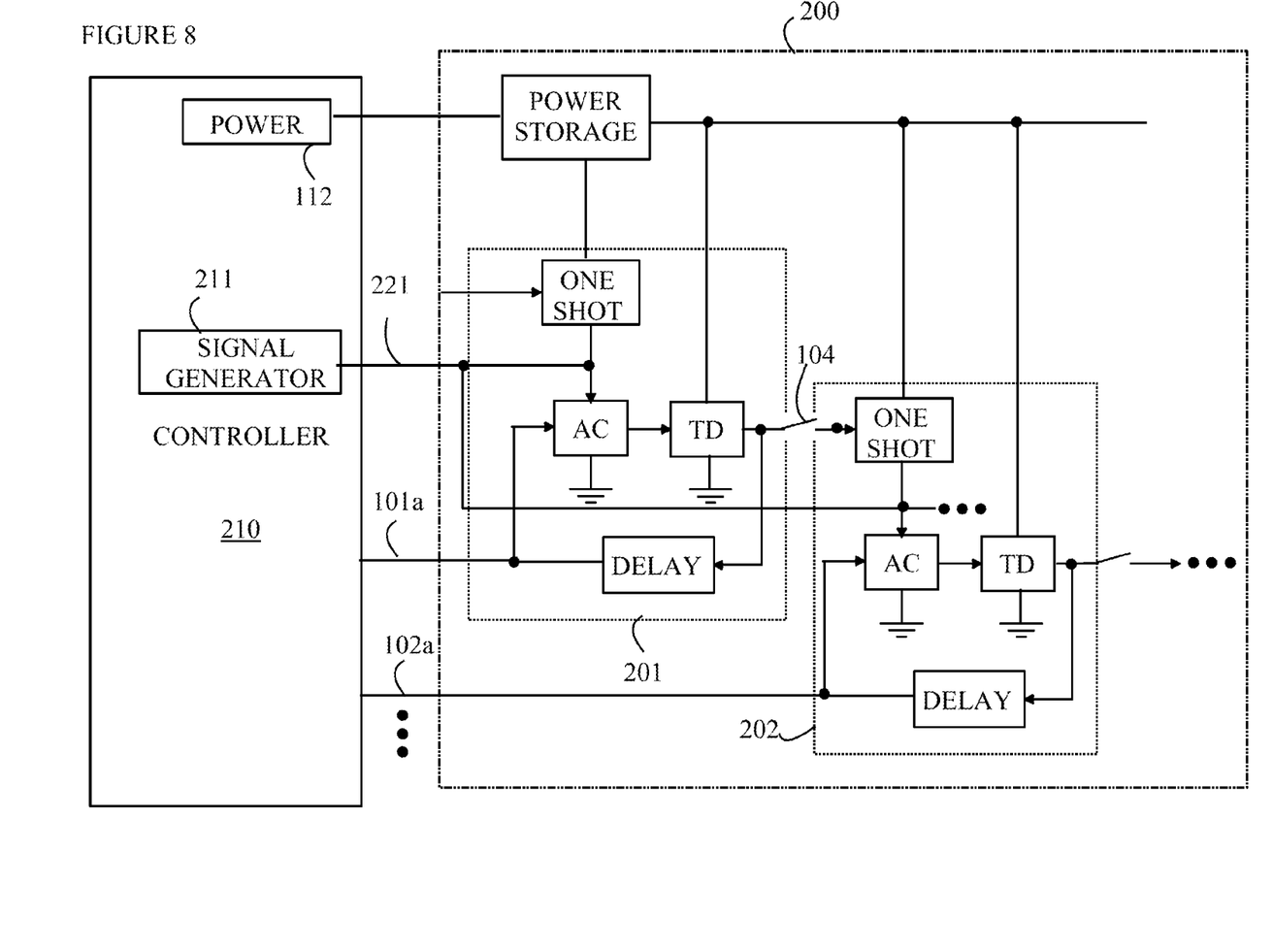
FIG. 8 illustrates a system in which the time that it takes for each stage to generate a count complete signal after a long readout pulse is applied to the count input to that stage is used to read the count stored in the stage.

The above-discussed system utilizes a readout mechanism in which the various stages are pulsed and the number of pulses needed to readout each stage is determined. As noted above, a counter stage can be readout by applying a long DC signal to the count input of that stage and measuring the time between the start of that signal and the time at which the count complete signal from that stage is observed. Refer now to FIG. 8, which illustrates a system in which the counter is readout by measuring the time that it takes for each stage to generate a count complete signal after a long readout pulse is applied to the count input of that stage. Counter 200 includes a number of elements that are analogous to elements discussed above with respect to multi-stage counter 100. These elements have been given the same numerical designations as the analogous elements in counter 100 and will not be discussed in detail here. Counter 200 has a plurality of count stages such as stages 201 and 202. Counter 200 differs from counter 100 in that a separate readout port 221 couples the count input of each autonomous memory cell to an external readout controller 210. A signal generator 211 generates a continuous readout pulse that is applied to readout port 221. Each count stage of counter 200 is isolated from the other stages by switches such as isolation switch 104. External readout controller 210 has access to the count complete signals generated in each count stage via ports 101a, 102a, . . . . The controller measures the times from the start of the readout pulse to the time at which a count complete signal is detected on each of these ports.

Refer again to FIG. 2A. The maximum count that can be stored in a single stage counter depends on the ratio of the charge transferred to the ferroelectric capacitor during each pulse to the total charge needed to flip the polarization of the ferroelectric capacitor. Assume that the ferroelectric capacitor starts in a configuration that is fully polarized down. Each positive pulse on the count line moves the polarization toward the state in which the ferroelectric capacitor is fully polarized in the up direction. When the ferroelectric capacitor reaches the fully polarized state, the counter is saturated and the voltage at node 49 rises to the voltage of the pulse.

To maximize the count, the ratio of the charge needed to flip the polarization of the capacitor to the charge transferred by a pulse must be maximized. In principle, using a large resistor as the conductive load results in a small charge being transferred to the ferroelectric capacitor. However, there is a limit to the minimum size of the pulse charge that is set by noise. To reduce the noise, it is advantageous to have the conductive load, i.e., resistor 44, as small as possible. However, a small conductive load results in a larger charge being transferred to node 49 unless a portion of the charge is shunted around the ferroelectric capacitor. Hence, to provide a larger count, the size of the ferroelectric capacitor must be increased and/or the part of the charge that is shunted around the ferroelectric capacitor by transistor 46 must be increased. The fraction of the charge that is shunted around the ferroelectric capacitor depends on the beta of transistor 46. Hence, the maximum count can also be increased by increasing the beta of transistor 46.

It should be noted that the shelf voltage on which the present invention depends is a function of the ferroelectric capacitor and the conductive load. If the switch were removed leaving a ferroelectric capacitor in series with the conductive load, a shelf voltage effect similar to that described above would be observed if the ferroelectric capacitor started in one polarized state and the pulse moved the ferroelectric capacitor toward the other polarized state. However, a large conductive load would be needed as all of the charge generated by the pulse enters the ferroelectric capacitor. As noted above, the switch provides a mechanism for shunting part of the current around the ferroelectric capacitor. In addition, the switch allows the ferroelectric capacitor to reset to the down state again by inputting a pulse having the same polarity as the count pulse into the control input of the switch while keeping the count line connected to ground. Hence, the arrangement shown in FIG. 2A is particularly advantageous in that a single transistor provides both of these functions.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. An apparatus comprising:
 a first count stage comprising:
 a ferroelectric capacitor characterized by first and second polarization states;
 a variable impedance element having an impedance between first and second switch terminals that is determined by a signal on a control terminal, said ferroelectric capacitor being connected between said control terminal and said first switch terminal;
 a reset port configured to connect a reset signal to said control terminal, said reset signal causing said ferroelectric capacitor to be polarized in said first polarization state;
 a count port configured to receive pulses to be counted, said count port being connected to said first switch terminal by a conductive load; and
 a detector that generates a count complete signal if a potential on said first switch terminal exceeds a threshold value while said count port is receiving one of said pulses.

2. The apparatus of claim 1 wherein said detector is powered by said received pulses that are to be counted.

3. The apparatus of claim 1 wherein said count port comprises a circuit that generates a predetermined pulse from each of said received pulses, said predetermined pulse being coupled to said conductive load.

4. The apparatus of claim 1 further comprising a delay circuit that couples said count complete signal to said reset port after a predetermined time delay.

5. The apparatus of claim 1 wherein said first count stage comprises a delay circuit that couples said count complete signal of said first count stage to said reset port of said first count stage after a predetermined time delay, and wherein said apparatus further comprises a second count stage, said second count stage comprising:
- a second count stage comprising:
- a ferroelectric capacitor characterized by first and second polarization states;
- a variable impedance element having an impedance between first and second switch terminals that is determined by a signal on a control terminal, said ferroelectric capacitor being connected between said control terminal and said first switch terminal;
- a reset port configured to connect a reset signal to said control terminal, said reset signal causing said ferroelectric capacitor to be polarized in said first polarization state;
- a count port configured to receive pulses to be counted, said count port being connected to said first switch terminal by a conductive load;
- a detector that generates a count complete signal if a potential on said first switch terminal exceeds a threshold value while said count port is receiving one of said pulses, wherein
- said count complete signal of said first count stage is coupled to said count port of said second count stage.

6. The apparatus of claim 5 further comprising a disconnect switch that decouples said count complete signal of said first count stage from said count port of said second count stage.

7. The apparatus of claim 5 further comprising a parallel connect switch that connects said count port of said first count stage to said count port of said second count stage.

8. The apparatus of claim 5 further comprising first and second count complete terminals coupled to said detectors in said first and second count stages, respectively, said count complete terminals being accessible by a device external to said apparatus.

9. A method for counting pulse, said method comprising:
providing a first count stage comprising:
- a ferroelectric capacitor characterized by first and second polarization states; and
- a variable impedance element having an impedance between first and second switch terminals that is determined by a signal on a control terminal, said ferroelectric capacitor being connected between said control terminal and said first switch terminal;
causing said ferroelectric capacitor to be polarized in said first polarization state;
applying a plurality of pulses to be counted to said first switch terminal through a conductive load; and
generating a count complete signal if a potential on said first switch terminal exceeds a threshold value when one of said plurality of pulses is applied.

10. The method of claim 9 wherein said count complete signal is generated by a circuit that is powered solely from said plurality of pulses.

11. The method of claim 9 wherein each of said plurality of pulses is characterized by a pulse duration and a pulse amplitude and wherein said pulse duration and said pulse amplitude of each of said plurality of pulses are identical.

12. The method of claim 9 causing said ferroelectric capacitor to be polarized in said first polarization state after a delay when said count complete signal is generated.

13. The method of claim 9 further comprising determining a number of pulses that have been applied to said first switch terminal since said ferroelectric capacitor was caused to be in said first polarization state by determining a number of additional pulses that must be applied to said first switch terminal to cause said first switch terminal to exceed said threshold value.

14. The method of claim 9 further comprising providing a second count stage comprising:
- a ferroelectric capacitor characterized by first and second polarization states; and
- a variable impedance element having an impedance between first and second switch terminals that is determined by a signal on a control terminal, said ferroelectric capacitor being connected between said control terminal and said first switch terminal;
causing said ferroelectric capacitor of said second count stage to be polarized in said first polarization state; and
applying a signal derived from said count complete signal generated by said first count stage to said first switch terminal of said second count stage.

15. The method of claim 14 further comprising:
isolating said first count stage from said second count stage; and
determining a number of pulses that have been applied to said first switch terminal of each of said first and second count stages by independently determining the number of additional pulses that must be applied to said first switch terminal of each of said first and second count stages to cause said first switch terminal of each of said first and second count stages to exceed said threshold value.

16. A system comprising:
a first count stage comprising:
- a ferroelectric capacitor characterized by first and second polarization states;
- a variable impedance element having an impedance between first and second switch terminals that is determined by a signal on a control terminal, said ferroelectric capacitor being connected between said control terminal and said first switch terminal;
- a reset port configured to connect a reset signal to said control terminal, said reset signal causing said ferroelectric capacitor to be polarized in said first polarization state;
- a count port configured to receive pulses to be counted, said count port being connected to said first switch terminal by a conductive load; and
- a detector that generates a count complete signal if a potential on said first switch terminal exceeds a threshold value while said count port is receiving one of said pulses; and
a readout circuit comprising:
- a readout generator that couples a readout signal to said count port; and
- a controller that determines a number of pulses needed to cause said detector to generate said count complete signal.

17. The system of claim 16 wherein said readout signal comprises a series of readout pulses.

18. The system of claim 16 wherein said readout signal comprises a DC signal that is applied at a first time and said controller measures a time at which said count complete signal is generated relative to said first time.

19. The system of claim 16 wherein said readout circuit is a separate detachable component from said first count stage.

20. The system of claim 16 further comprising:
a second count stage comprising:
a ferroelectric capacitor characterized by first and second polarization states;
a variable impedance element having an impedance between first and second switch terminals that is determined by a signal on a control terminal, said ferroelectric capacitor being connected between said control terminal and said first switch terminal;
a reset port configured to connect a reset signal to said control terminal, said reset signal causing said ferroelectric capacitor to be polarized in said first polarization state;
a count port configured to receive pulses to be counted, said count port being connected to said first switch terminal by a conductive load;
a detector that generates a count complete signal if a potential on said first switch terminal exceeds a threshold value while said count port is receiving one of said pulses, wherein
said count complete signal of said first count stage is coupled to said count port of said second count stage.

21. The system of claim 20 further comprising a disconnect switch that blocks said count complete signal of said first count stage from being coupled to said count port of said second count stage.

22. The system of claim 21 wherein said readout circuit couples said readout signal to said second count stage and detects said count complete signal generated by said second count stage.

\* \* \* \* \*